United States Patent
Cormier et al.

(10) Patent No.: US 12,439,525 B2
(45) Date of Patent: Oct. 7, 2025

(54) METHOD FOR OPERATING A METAL DROP EJECTING THREE-DIMENSIONAL (3D) OBJECT PRINTER TO FORM VIAS IN PRINTED CIRCUIT BOARDS WITH CONDUCTIVE METAL

(71) Applicant: ADDITIVE TECHNOLOGIES LLC, Palm City, FL (US)

(72) Inventors: Denis Cormier, Pittsford, NY (US); Santokh S. Badesha, Pittsford, NY (US); Varun Sambhy, Pittsford, NY (US)

(73) Assignee: Additive Technologies LLC, Palm City, FL (US)

( * ) Notice: Subject to any disclaimer, the term of this patent is extended or adjusted under 35 U.S.C. 154(b) by 76 days.

(21) Appl. No.: 18/318,974

(22) Filed: May 17, 2023

(65) Prior Publication Data
US 2023/0309241 A1    Sep. 28, 2023

Related U.S. Application Data

(62) Division of application No. 17/155,455, filed on Jan. 22, 2021, now Pat. No. 11,737,216.

(51) Int. Cl.
*H05K 3/12* (2006.01)
*H05K 3/40* (2006.01)
*H05K 13/00* (2006.01)

(52) U.S. Cl.
CPC ........... *H05K 3/125* (2013.01); *H05K 3/4046* (2013.01); *H05K 3/4053* (2013.01); *H05K 13/0092* (2013.01); *H05K 2203/128* (2013.01)

(58) Field of Classification Search
CPC .... H05K 3/125; H05K 3/4046; H05K 3/4053; H05K 13/0092; H05K 2203/128
See application file for complete search history.

(56) References Cited

U.S. PATENT DOCUMENTS

| | | | | |
|---|---|---|---|---|
| 3,838,204 A | * | 9/1974 | Ahn | H05K 3/4061 361/779 |
| 4,131,516 A | * | 12/1978 | Bakos | H05K 3/328 428/668 |
| 5,808,636 A | * | 9/1998 | Stearns | B41J 2/14008 347/46 |
| 8,021,593 B2 | * | 9/2011 | Murata | B81C 99/0095 425/375 |
| 9,993,964 B2 | * | 6/2018 | Mantell | B29C 64/393 |

(Continued)

FOREIGN PATENT DOCUMENTS

| | | | | |
|---|---|---|---|---|
| CN | 106077636 A | | 11/2016 | |
| CN | 111385978 A | * | 7/2020 | ............... H05K 1/09 |

(Continued)

*Primary Examiner* — Jeffrey T Carley
(74) *Attorney, Agent, or Firm* — Maginot Moore & Beck LLP

(57) ABSTRACT

A method for operating a three-dimensional (3D) metal object manufacturing apparatus selects operational parameters for operation of the printer to form vias in substrates. The method identifies the bulk metal being melted for ejection and uses this identification data to select the operational parameters. The method identifies the via holes in the substrate and operates an actuator to position an ejector opposite the via holes to eject drops of melted bulk metal toward the via holes to fill the via holes.

19 Claims, 5 Drawing Sheets

(56) References Cited

U.S. PATENT DOCUMENTS

| | | | |
|---|---|---|---|
| 10,548,231 B2* | 1/2020 | Knox | H05K 3/4685 |
| 2003/0019568 A1 | 1/2003 | Liu et al. | |
| 2011/0220610 A1 | 9/2011 | Tredwell et al. | |
| 2014/0039659 A1* | 2/2014 | Boyer | B33Y 40/00 |
| | | | 700/98 |
| 2014/0048969 A1* | 2/2014 | Swanson | B29C 64/209 |
| | | | 264/129 |
| 2014/0121813 A1* | 5/2014 | Schmehl | B33Y 70/00 |
| | | | 700/119 |
| 2015/0201499 A1* | 7/2015 | Shinar | H05K 1/0284 |
| | | | 425/132 |
| 2015/0273577 A1 | 10/2015 | Vader et al. | |
| 2015/0375246 A1* | 12/2015 | Kalistaja | B05B 17/04 |
| | | | 174/250 |
| 2016/0167298 A1* | 6/2016 | Mantell | B29C 64/393 |
| | | | 425/145 |
| 2016/0318130 A1 | 11/2016 | Stempfer et al. | |
| 2016/0320771 A1* | 11/2016 | Huang | B33Y 50/00 |
| 2016/0324009 A1 | 11/2016 | Wicker et al. | |
| 2017/0048985 A1 | 2/2017 | Knox et al. | |
| 2017/0056970 A1 | 3/2017 | Chin et al. | |
| 2017/0087632 A1 | 3/2017 | Mark | |
| 2017/0252827 A1 | 9/2017 | Sachs et al. | |
| 2018/0275634 A1* | 9/2018 | Mcfarland | G05B 19/4099 |
| 2018/0297114 A1 | 10/2018 | Preston et al. | |
| 2019/0164890 A1 | 5/2019 | Yeoh et al. | |
| 2022/0032550 A1 | 2/2022 | Mantell et al. | |

FOREIGN PATENT DOCUMENTS

| | | |
|---|---|---|
| WO | 2012136478 | 10/2012 |
| WO | 2015117125 | 8/2015 |

* cited by examiner

METHOD FOR OPERATING A METAL DROP EJECTING THREE-DIMENSIONAL (3D) OBJECT PRINTER TO FORM VIAS IN PRINTED CIRCUIT BOARDS WITH CONDUCTIVE METAL

PRIORITY CLAIM

This application is a divisional application of and claims priority to co-pending U.S. patent application Ser. No. 17/155,455, which was filed on Jan. 22, 2021 and is entitled "Method And System For Operating A Metal Drop Ejecting Three-Dimensional (3D) Object Printer To Fill Vias In Printed Circuit Boards With Conductive Metal," and which issued as U.S. Pat. No. 17,155,455 on Aug. 22, 2023.

TECHNICAL FIELD

This disclosure is directed to melted metal ejectors used in three-dimensional (3D) object printers and, more particularly, to operation of the ejectors to form electrical circuits on substrates.

BACKGROUND

Three-dimensional printing, also known as additive manufacturing, is a process of making a three-dimensional solid object from a digital model of virtually any shape. Many three-dimensional printing technologies use an additive process in which an additive manufacturing device forms successive layers of the part on top of previously deposited layers. Some of these technologies use ejectors that eject UV-curable materials, such as photopolymers or elastomers. The printer typically operates one or more extruders to form successive layers of the plastic material that form a three-dimensional printed object with a variety of shapes and structures. After each layer of the three-dimensional printed object is formed, the plastic material is UV cured and hardens to bond the layer to an underlying layer of the three-dimensional printed object. This additive manufacturing method is distinguishable from traditional object-forming techniques, which mostly rely on the removal of material from a work piece by a subtractive process, such as cutting or drilling.

Recently, some 3D object printers have been developed that eject drops of melted metal from one or more ejectors to form 3D objects. These printers have a source of solid metal, such as a roll of wire or pellets, that are fed into a heating chamber where they are melted and the melted metal flows into a chamber of the ejector. The chamber is wrapped with an uninsulated electrical wire. An electrical current is passed through the conductor to produce an electromagnetic field to cause the meniscus of the melted metal at a nozzle of the chamber to separate from the melted metal within the chamber and be propelled from the nozzle. A platform opposite the nozzle of the ejector is moved in a X-Y plane parallel to the plane of the platform by a controller operating actuators so the ejected metal drops form metal layers of an object on the platform and another actuator is operated by the controller to alter the position of the ejector or platform in the vertical or Z direction to maintain a constant distance between the ejector and an uppermost layer of the metal object being formed. This type of metal drop ejecting printer is also known as a magnetohydrodynamic printer.

Some electronic devices are currently manufactured using direct write (DW) methods. These DW methods include inkjet printing, aerosol jet printing, and micro-dispensing. In these methods, solvent-based inks containing electrically conductive nanoparticles are deposited onto substrates to form metal traces or lines of conductive material on a substrate and these traces are connected to one another and to some leads of electronic components positioned on the substrate to form an electronic device. Examples of substrates include silicon wafers, their oxides, or other electrical components integrated into or deposited on the wafer. Substrates can also be made from polymer, ceramic, or glass.

One of the issues associated with these DW methods is the formation of vias or through holes in the substrate. Vias are electrically conductive structures that connect one layer or face of a circuit board to another layer or face of the circuit board. Thus, sometimes vias are referred to as vertical electrical traces. Several types of prior art vias are shown in FIG. 5. A through via 504 as shown in the figure is a vertical conductive trace along the wall of the via that electrically connects a horizontal circuit trace or pad 508 on one face 520 of the circuit board to a horizontal circuit trace or pad 512 on the opposing face 524 of the circuit board. A blind via 516 is a conductive trace along the wall of the via that connects a horizontal circuit trace or pad 528 on the face 520 of the circuit board to a horizontal circuit trace or pad 532 on an intermediate layer 436 between the opposing faces 520 and 524 of the circuit board. A buried via 540 is a vertical conductive trace along the wall of the via that connects a horizontal circuit trace or pad 544 on the layer 536 between the opposing faces 520 and 524 of the circuit board to a horizontal circuit trace or pad 548 on another layer 552 between the opposing faces of the circuit board.

These various types of vias are first formed in one or more layers of a circuit board by mechanical or laser drilling in the substrate followed by an electroplating or other known technique for applying electrically conductive material, such as copper, to the walls of the drilled hole to connect electrically an upper surface of a substrate to a lower surface of the substrate or, in the case of multi-layer printed circuit boards (PCBs) to connect one layer electrically to another layer. Preparation of the vias typically requires etching or other chemical treatment before applying the electrically conductive material to the walls of the vias. Additionally, flexing of the circuit board can crack or otherwise affect the electrically conductivity of the vias since the coating of the walls by known techniques can be relatively thin.

A melted metal drop ejector has been developed that forms electrical traces on a substrate with the melted metal drops but the completion of the vias still requires electroplating and other known techniques. Being able to form apply conductive metal within vias in a substrate from known metal drop ejectors would be beneficial.

SUMMARY

A new method of operating a metal ejecting 3D object printer forms vias in substrates in conjunction with the formation of electrical traces on the substrate. The method includes identifying a bulk metal to be received and melted by a melter using a digital data model of a substrate having a plurality of via holes, identifying locations of each via hole in the substrate using the digital data model, generating machine ready instructions for moving and operating an ejector operatively connected to the melter to fill the via holes at the identified locations, and executing the machine ready instructions to move and operate the ejector to position the ejector opposite the identified locations for the via holes in the substrate and eject drops of the melted bulk metal toward the via holes at the identified locations until each via hole is filled.

A new 3D metal object apparatus forms vias in substrates in conjunction with the formation of electrical traces on the substrate. The apparatus includes a melter configured to receive and melt a bulk metal, an ejector operatively connected to the melter to receive melted bulk metal from the melter, a platform configured to support a substrate having a plurality of via holes in the substrate, the platform being positioned opposite the ejector, at least one actuator operatively connected to at least one of the platform and the ejector, the at least one actuator being configured to move the platform and the ejector relative to one another, a user interface configured to receive a digital data model of a substrate and user input data, and a controller operatively connected to the melter, the ejector, the user interface, and the at least one actuator. The controller is configured to identify the bulk metal to be received by the melter using the digital data model, identify locations of the via holes in the substrate using the digital data model, generate machine ready instructions for moving and operating the ejector to fill the via holes at the identified locations, and execute the machine ready instructions to operate the ejector, the at least one actuator, and the melter to position the ejector opposite the identified locations for the via holes in the substrate and eject drops of the melted bulk metal toward the via holes at the identified locations until each via hole is filled.

BRIEF DESCRIPTION OF THE DRAWINGS

The foregoing aspects and other features of a metal ejecting 3D object printer and its operation to form vias in substrates in conjunction with the formation of electrical traces on the substrate are explained in the following description, taken in connection with the accompanying drawings.

DETAILED DESCRIPTION

Figure 1:
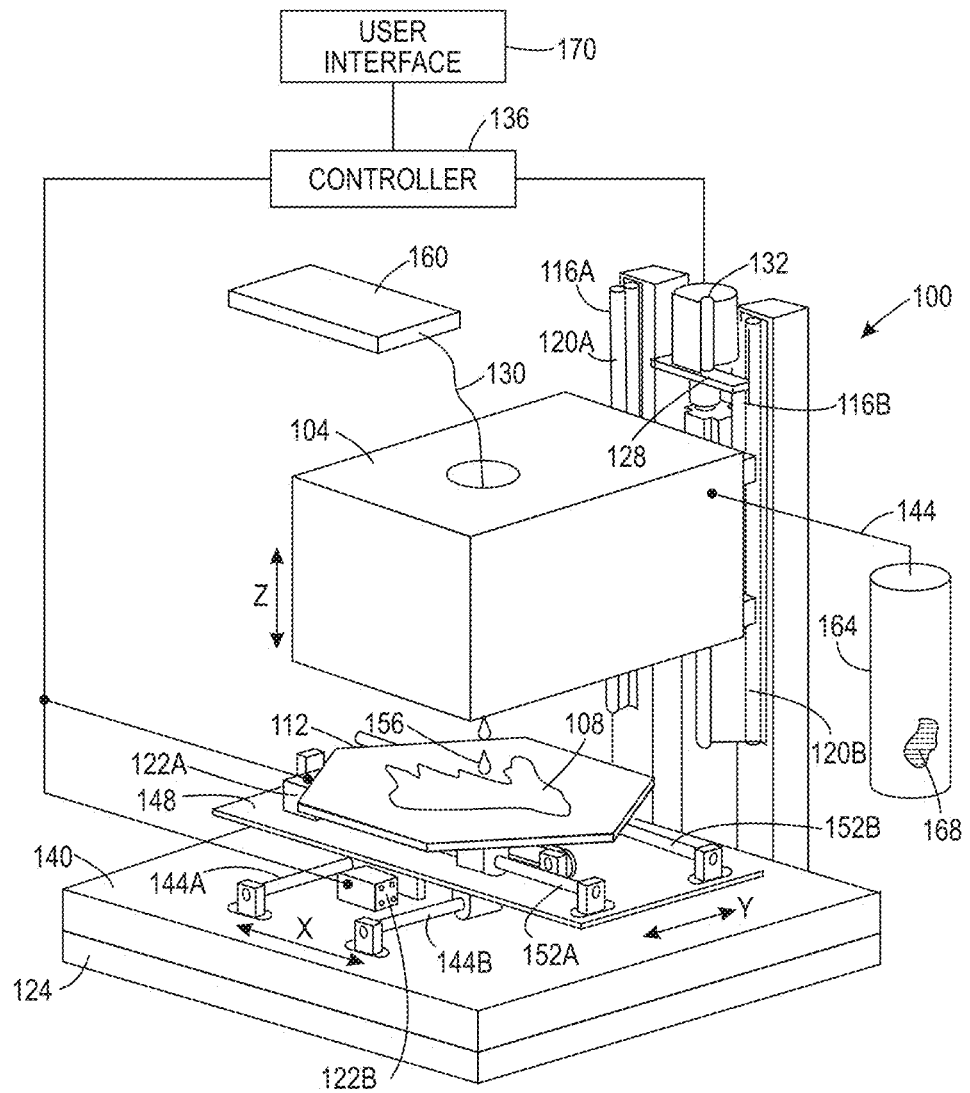
FIG. 1 depicts an additive manufacturing system that operates a liquid metal drop ejector to form vias in substrates in conjunction with the formation of electrical traces on the substrate.

For a general understanding of the environment for the system and its operation as disclosed herein as well as the details for the device and its operation, reference is made to the drawings. In the drawings, like reference numerals designate like elements.

FIG. 1 illustrates an embodiment of a melted metal 3D object printer 100 that forms vias in substrates in conjunction with the formation of electrical traces on the substrate. In this embodiment, drops of melted bulk metal are ejected from a printhead 104 having one or more ejectors and these drops form metal traces on a substrate 108 laying on a platform 112. As used in this document, the term "bulk metal" means conductive metal available in aggregate form, such as wire of a commonly available gauge or pellets of macro-sized proportions. A source of bulk metal 160, such as metal wire 130, is fed into the printhead and melted to provide melted metal for a chamber within the printhead. An inert gas supply 164 provides a pressure regulated source of an inert gas 168, such as argon or nitrogen, to the melted metal in the printhead 104 through a gas supply tube 144 to prevent the formation of metal oxide in the printhead.

The printhead 104 is movably mounted within Z-axis tracks 116A and 116B in a pair of vertically oriented members 120A and 120B, respectively. Members 120A and 120B are connected at one end to one side of a frame 124 and at another end to one another by a horizontal member 128. An actuator 132 is mounted to the horizontal member 128 and operatively connected to the printhead 104 to move the printhead along the Z-axis tracks 116A and 116B. The actuator 132 is operated by a controller 136 to maintain a predetermined distance between one or more nozzles (not shown in FIG. 1) of the printhead 104 and an uppermost surface of the substrate 108 on the platform 112 and the traces being formed on the substrate 108.

Mounted to the frame 124 is a planar member 140, which can be formed of granite or other sturdy material to provide reliably solid support for movement of the platform 112. Platform 112 is affixed to X-axis tracks 144A and 144B so the platform 112 can move bidirectionally along an X-axis as shown in the figure. The X-axis tracks 144A and 144B are affixed to a stage 148 and stage 148 is affixed to Y-axis tracks 152A and 152B so the stage 148 can move bidirectionally along a Y-axis as shown in the figure. Actuator 122A is operatively connected to the platform 112 and actuator 122B is operatively connected to the stage 148. Controller 136 operates the actuators 122A and 122B to move the platform along the X-axis and to move the stage 148 along the Y-axis to move the platform in an X-Y plane that is opposite the printhead 104. Performing this X-Y planar movement of platform 112 as drops of molten metal 156 are ejected toward the platform 112 forms a line of melted metal drops on the substrate 108. Controller 136 also operates actuator 132 to adjust the vertical distance between the printhead 104 and the most recently formed layer on the substrate to facilitate formation of other structures on the substrate. While the molten metal 3D object printer 100 is depicted in FIG. 1 as being operated in a vertical orientation, other alternative orientations can be employed. Also, while the embodiment shown in FIG. 1 has a platform that moves in an X-Y plane and the printhead moves along the Z axis, other arrangements are possible. For example, the printhead 104 can be configured for movement in the X-Y plane and along the Z axis. Additionally, while the printhead 104 has only one nozzle, it is configured in other embodiments with an orifice plate having multiple orifices fluidly connected to the nozzle to increase the metal deposition rate of the ejector.

The controller 136 can be implemented with one or more general or specialized programmable processors that execute programmed instructions. The instructions and data required to perform the programmed functions can be stored in memory associated with the processors or controllers. The processors, their memories, and interface circuitry configure the controllers to perform the operations previously described as well as those described below. These components can be provided on a printed circuit card or provided as a circuit in an application specific integrated circuit (ASIC). Each of the circuits can be implemented with a separate processor or multiple circuits can be implemented on the same processor. Alternatively, the circuits can be implemented with discrete components or circuits provided in very large scale integrated (VLSI) circuits. Also, the circuits described herein can be implemented with a combination of processors, ASICs, discrete components, or VLSI circuits. During electronic device formation, image data for a structure to be produced are sent to the processor or processors for controller 136 from either a scanning system or an online or work station connection for processing and generation of the printhead control signals output to the printhead 104.

The controller 136 of the melted metal 3D object printer 100 requires data from external sources to control the printer for electronic circuit manufacture. In general, a three-dimensional model or other digital data model of the device to be formed is stored in a memory operatively connected to the controller 136, the controller can access through a server or the like a remote database in which the digital data model is stored, or a computer-readable medium in which the digital data model is stored can be selectively coupled to the controller 136 for access. In the application being discussed, namely, the formation of electrical circuits on a substrate, the digital map depicts the circuit layout on the substrate and the locations of the leads on the electronic components to which at least some of the electrical traces are connected. This three-dimensional model or other digital data model can be used by the controller to generate machine-ready instructions for execution by the controller 136 in a known manner to operate the components of the printer 100 and form the electrical device corresponding to the model. The generation of the machine-ready instructions can include the production of intermediate models, such as when a CAD model of the device is converted into an STL data model, or other polygonal mesh or other intermediate representation, which can in turn be processed to generate machine instructions, such as g-code for fabrication of the device by the printer. As used in this document, the term "machine-ready instructions" means computer language commands that are executed by a computer, microprocessor, or controller to operate components of a 3D metal object additive manufacturing system to form metal structures on a substrate. The controller 136 executes the machine-ready instructions to control the ejection of the melted metal drops from the printhead 104, the positioning of stage 148 and the platform 112, as well as the distance between the printhead 102 and the uppermost layer of the structures on the substrate 108. Additionally, the digital data model can be used by the controller 136 to operate a mechanical drill or laser (not shown) to form the holes in the substrate where vias are located.

The effects of metal trace formation on a substrate are a function of initial drop spacing, drop volume, the number of metal drops, the sequence and placement of drops, and the temperature at which the melted metal drops are ejected. Similarly, the formation of the vias after they are drilled is a function of the frequency of the melted metal drop ejection into the drilled hole, the number of metal drops, the size of the drops, the temperature of the drops into the drilled holes, and the type of metal ejected into the drilled holes.

The behavior of metal drops on substrates and in the vias can be controlled using a number of parameters that are adjustable in the printing process. These parameters include: drop frequency, spacing, temperature of the drops, and temperature of the substrate. These parameters can be used to control the metal drop freezing process and the application of electrically conductive metal to the drilled holes for the vias. Various modes of via formation behavior can be seen as these parameters are varied, which makes the process more or less suitable for the completion of the vias. Part of the digital model of the device identifies the material of the substrate and the metal being fed to the printhead. Alternatively or additionally, these parameters can be entered by an operator through the user interface 170 of FIG. 1.

In one embodiment of the system 100, the alternating current pulses in the electromagnetic coil surrounding the printhead can be independently varied with respect to pulse length, pulse voltage, and frequency of pulse application to provide control over the dynamics of the melted drop ejection into the drilled holes for the vias. Drops are typically ejected at a velocity of 1 to 10 meters/second, although other velocities are possible. Additionally, nozzle orifice diameter, the distance between a nozzle orifice and the surface receiving a drop, drop temperature, substrate temperature, drop size, and drop spacing can also affect the dynamics of melted drop ejection and interaction between the melted drops and the walls of the drilled holes for the vias. As used in this document, the term "drop spacing" means the distance between the centers of adjacent drops in a sequence of melted metal drops ejected into the drilled holes for the vias.

Figure 2:
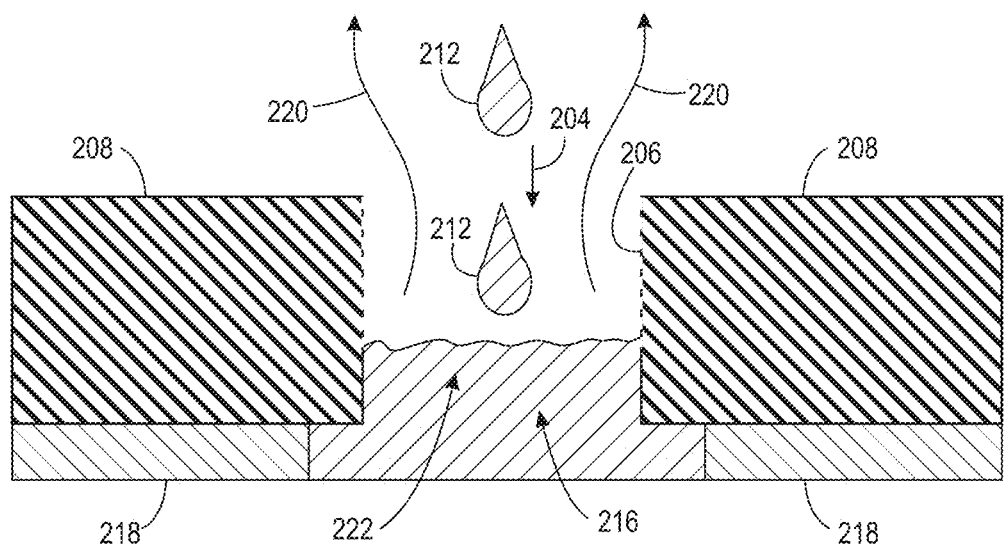
FIG. 2 depicts a method of operating the system of FIG. 1 to fill blind via holes with ejected metal drops that have a diameter that is less than a diameter of the through holes.

The process of operating the metal drop ejecting system 100 disclosed in this document fills via holes with conductive metal as opposed to coating the walls of the via holes with a thin layer of metal. In one embodiment of the process, as shown in FIG. 2, a blind via hole 204 having a wall 206 is formed in the circuit board 208. Because hole 204 is a blind via hole, another substrate 222 is beneath the hole and acts as a bottom to the hole. Drops 212 of molten metal having an average diameter that is less than the diameter of the blind via hole are ejected into the via hole. These drops spread and solidify as they cool so the solidified metal 216 contacts the conductive traces 218 on the substrate 222. Eventually, the solidified metal 216 fills the blind via hole in a bottom up manner as the ejected conductive metal drops land on the previously solidified metal and solidify as they cool. By ejecting drops that have a diameter that is less than the diameter of the blind via hole, air is expelled from the hole as indicated by the arrows 220 in the figure. If the drops had a diameter larger than the diameter of the blind via hole, they could cover the entire hole opening and trap air inside the blind via hole. This hole covering and trapped air prevents the via hole from being completely filled with metal.

Figure 3:
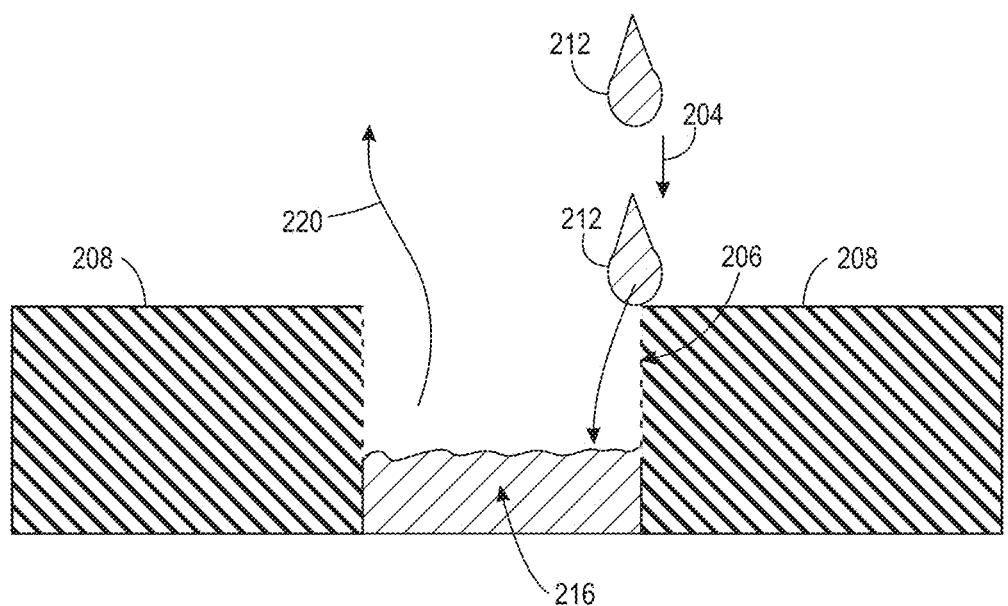
FIG. 3 depicts a method of operating the system of FIG. 1 to fill blind via holes with ejected metal drops that have a diameter that is equal to or greater than a diameter of the blind via holes.

In another embodiment of the process, as shown in FIG. 3, the blind via hole 204 having a wall 206 can be filled with drops 212 of molten metal having an average diameter that is equal to or greater than the diameter of the blind via hole. These drops are not ejected into the center of the blind via hole but are instead ejected so the overlap the wall 206. Thus, a portion of the ejected metal drop flows down the wall until it cools and solidifies in the hole. In this manner, metal extends from the wall of the blind via hole into the opening of the hole. By ejecting subsequent drops so they overlap with the solidified metal 216 on the wall of the blind via hole, the hole is filled in a bottom up manner since the air can escape as shown by the arrow 220. Using this technique, the metal drop ejecting system can also fill a through via hole. Buried via holes are filled in the same manner as the blind via hole since multi-layer boards are typically produced one layer after another. When the layer containing a buried via hole is the current uppermost layer, the buried via hole is filled as described above for a blind via hole. Then one or more subsequent board layers are fabricated on top of the layer containing the top of the filled via hole producing a buried via.

The process determines the number of jetted drops needed to fill a given via by identifying the cumulative volume of the drops ejected into a via hole. This cumulative volume is made to closely approximate the volume of the hole. If n drops having a diameter of $D_d$ are jetted into a via hole, the volume of jetted metal ($V_m$) is:

$$V_m = \frac{n \cdot \pi \cdot D_d^3}{6}$$

A via hole having a diameter of $D_v$ and a depth of $H_v$ will have a volume ($V_v$) of $$V_v = \frac{\pi \cdot D_v^2 \cdot H_v}{4}$$

Setting the two volumes equal to each other, and solving for n, the number of drops needed to fill the via is $$n = \frac{1.5 \cdot D_v^2 \cdot H_v}{D_d^3}$$

Drop diameter is closely related to the diameter of the orifice in the nozzle, the voltage of the pulse signal sent to the coil, and the pressure exerted by the molten metal in the reservoir above the nozzle orifice. In typical operation, the drop diameter is within +/−25% of the diameter of the orifice in the nozzle. Thus, the nozzle diameter of the ejector in system 100 when it is to be used for filling via holes is slightly smaller than the diameter of the via holes. For a 100 μm diameter via, a nozzle diameter of approximately 75 μm would be appropriate, for example.

For via hole filling, the temperature of the molten metal in the ejector head is regulated to be approximately 50° C. to 200° C. higher than the melting temperature of the metal being jetted. This temperature range helps ensure that the ejected metal drops do not cool down and solidify until after they have entered the via hole. For aluminum, the temperature of the melted metal is in the range of about 700° C. to about 900° C. For copper, the temperature of the melted metal is about 1100° to about 1300° C.

Figure 4:
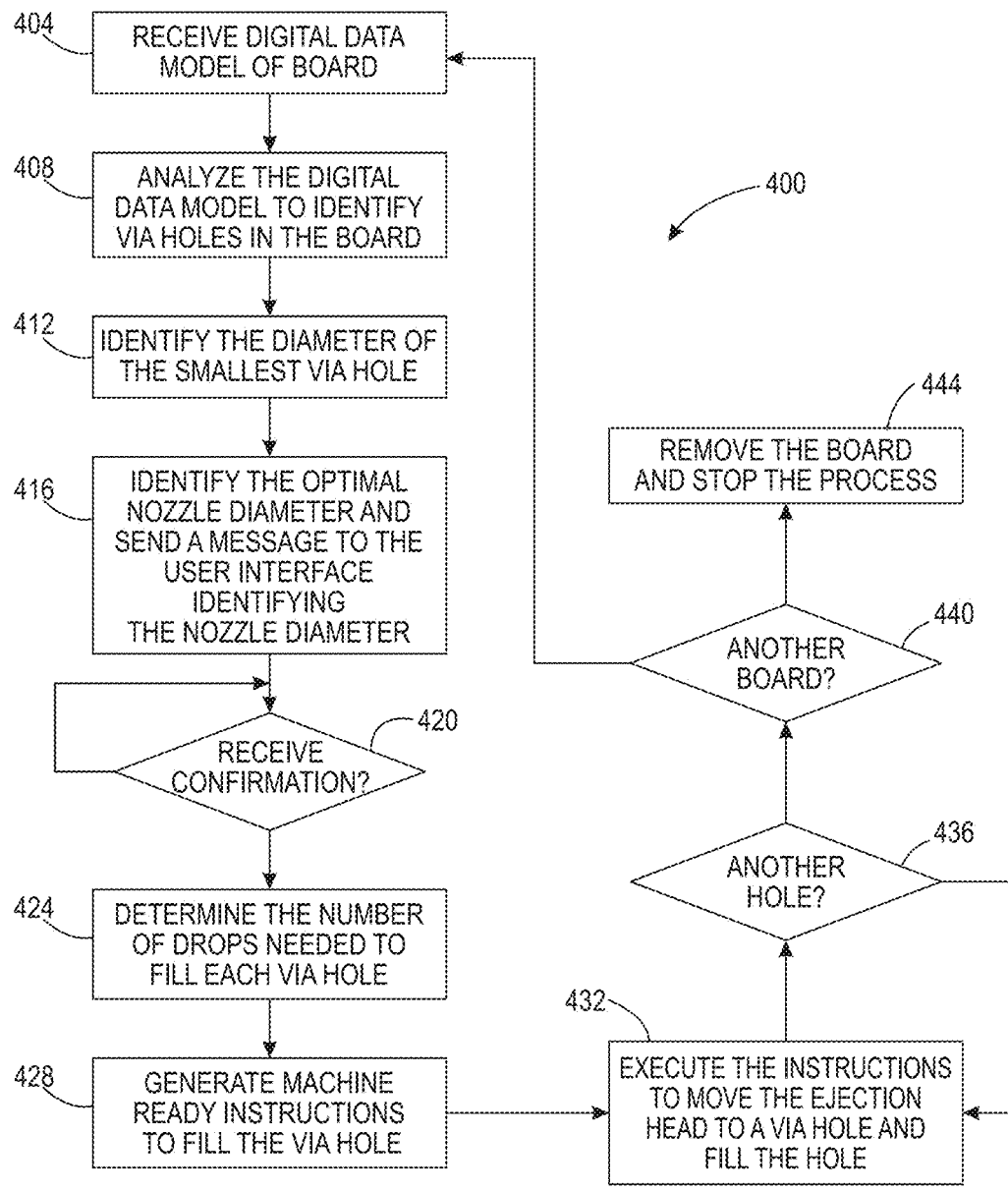
FIG. 4 is a flow diagram of a process for operating the system of FIG. 1 to fill via holes in a substrate.
Figure 5:
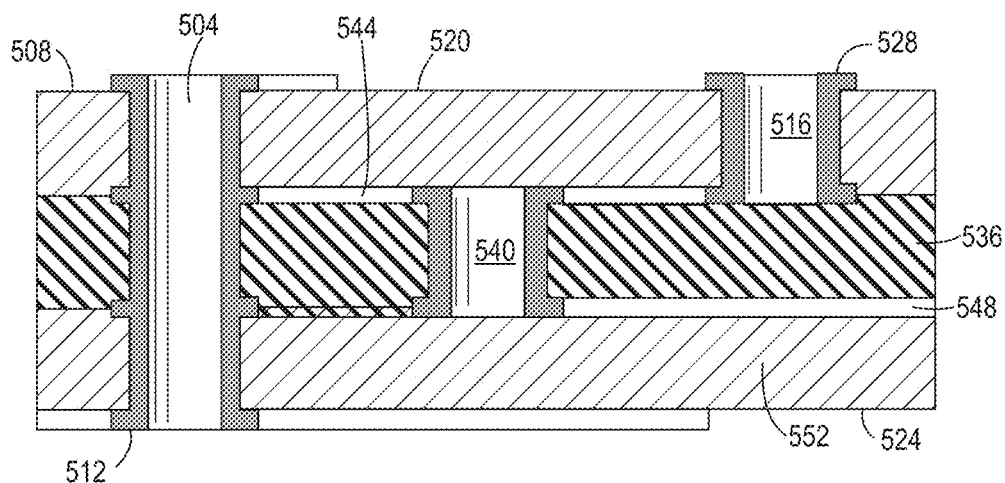
FIG. 5 illustrates the types of via holes known in the prior art.

A process for operating the printer shown in FIG. 1 is shown in FIG. 4. In the description of the process, statements that the process is performing some task or function refers to a controller or general purpose processor executing programmed instructions stored in non-transitory computer readable storage media operatively connected to the controller or processor to manipulate data or to operate one or more components in the printer to perform the task or function. The controller 136 noted above can be such a controller or processor. Alternatively, the controller can be implemented with more than one processor and associated circuitry and components, each of which is configured to form one or more tasks or functions described herein. Additionally, the steps of the method may be performed in any feasible chronological order, regardless of the order shown in the figures or the order in which the processing is described.

FIG. 4 is a flow diagram of a process that operates the printing system 100 to fill via holes in a substrate. The process 400 begins with receipt of a digital data model for the substrate (block 404). The digital data model is analyzed to identify the via holes in the substrate (block 408). The smallest diameter of a via hole is identified (block 412) and a message is sent to the user interface 170 that identifies the diameter of the nozzle that is optimal for filling the smallest hole (block 416). After a signal is received from the user interface that confirms a nozzle with the identified diameter is installed in the ejection head (block 420), the process determines the number of drops required to fill each via hole (block 424). The machine ready instructions for maneuvering the ejection head to each of the identified holes and operating the ejection head to fill each of the holes are generated (block 428). The machine ready instructions are then executed by the controller of system 100 to move the ejection head to a via hole and fill the via hole (block 432). This process continues until all of the via holes have been filled (block 436). The process determines whether the board is to be removed or another board is to be added (block 440). If another board is added, then the process is repeated for filling the via holes in the new board (blocks 404 through 440). Otherwise, the board is removed from the platform 112 and the process stops (block 444).

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A method for operating a metal drop ejecting apparatus comprising:
    using a digital data model of a substrate to identify a bulk metal to be received and melted in a printhead of the metal drop ejecting apparatus;
    identifying locations of via holes in the substrate using the digital data model, wherein each of the via holes is defined by at least one wall;
    identifying a smallest diameter for the via holes at the identified locations;
    identifying a nozzle diameter for the ejector corresponding to the identified smallest diameter;
    confirming that a nozzle with the identified nozzle diameter is installed in the ejection head;
    generating machine ready instructions for moving and operating at least one ejector in the printhead to fill the via holes at the identified locations; and
    executing the generated machine ready instructions to operate the ejector, at least one actuator, and the printhead to melt the bulk metal in the printhead, position the ejector opposite the identified locations for the via holes in the substrate, and eject drops of the melted bulk metal toward the via holes at the identified locations.

2. The method of claim 1 further comprising:
    operating the printhead to maintain a temperature of the melted bulk metal in the printhead within a range of 50° C. up to 200° C. above a melting point of the bulk metal identified by the digital data model.

3. The method of claim 1 further comprising:
    operating the printhead to maintain the temperature of the melted bulk metal in the printhead in a range of 700° C.

up to 900° C. when the digital data model identifies the bulk metal as being aluminum.

4. The method of claim 1 further comprising:
operating the printhead to maintain the temperature of the melted bulk metal in the printhead in a range of 1100° C. up to 1300° C. when the digital data model identifies the bulk metal as being copper.

5. The method of claim 1 further comprising:
identifying a predetermined ejection frequency corresponding to the bulk metal identified by the digital data model; and
operating the ejector to eject the drops of melted bulk metal toward the via holes at the identified predetermined ejection frequency.

6. The method of claim 1, the identification of the nozzle diameter further comprising:
identifying the nozzle diameter as being less than the identified smallest diameter for the via holes.

7. The method of claim 6 further comprising:
generating the machine ready instructions to position the ejector opposite the via holes to eject the drops of melted bulk metal into the via holes without the drops landing on the walls of the via holes.

8. The method of claim 1 further comprising:
identifying the nozzle diameter as being equal to or larger than the identified smallest diameter for the via holes.

9. The method of claim 8 further comprising:
generating the machine ready instructions to position the ejector opposite the via holes to eject the drops of melted bulk metal toward the via holes so only a portion that is less than an entirety of the drops engages a wall of the via holes or enters an opening of the via holes.

10. The method of claim 1 wherein each of the via holes is defined by at least one wall and the identified locations overlap the walls of the via holes.

11. A method for operating a metal drop ejecting apparatus comprising:
using a digital data model of a substrate to identify a bulk metal to be received and melted in a printhead of the metal drop ejecting apparatus;
identifying locations of via holes in the substrate using the digital data model, each of the via holes defined by at least one wall;
generating machine ready instructions for moving the at least one ejector in the printhead, positioning the at least one ejector opposite the via holes to eject the drops of melted bulk metal into the via holes without the drops landing on the walls of the via holes, and operating at least one ejector in the printhead to fill the via holes at the identified locations; and
executing the generated machine ready instructions to operate the ejector, at least one actuator, and the printhead to melt the bulk metal in the printhead, position the ejector opposite the identified locations for the via holes in the substrate and eject drops of the melted bulk metal toward the via holes at the identified locations without the drops landing on the walls of the via holes.

12. The method of claim 11 further comprising:
operating the printhead to maintain a temperature of the melted bulk metal in the printhead within a range of 50° C. up to 200° C. above a melting point of the bulk metal identified by the digital data model.

13. The method of claim 11 further comprising:
operating the printhead to maintain the temperature of the melted bulk metal in the printhead in a range of 700° C. up to 900° C. when the digital data model identifies the bulk metal as being aluminum.

14. The method of claim 11 further comprising:
operating the printhead to maintain the temperature of the melted bulk metal in the printhead in a range of 1100° C. up to 1300° C. when the digital data model identifies the bulk metal as being copper.

15. The method of claim 11 further comprising:
identifying a predetermined ejection frequency corresponding to the bulk metal identified by the digital data model; and
operating the ejector to eject the drops of melted bulk metal toward the via holes at the identified predetermined ejection frequency.

16. The method of claim 11 further comprising:
identifying a smallest diameter for the via holes at the identified locations; and
identifying a nozzle diameter for the ejector corresponding to the identified smallest diameter.

17. The method of claim 16, the identification of the nozzle diameter further comprising:
identifying the nozzle diameter as being less than the identified smallest diameter for the via holes.

18. The method of claim 16 further comprising:
identifying the nozzle diameter as being equal to or larger than the identified smallest diameter for the via holes.

19. The method of claim 11 wherein ejecting drops of the melted bulk metal toward the via holes at the identified locations results in the via holes being filled with the bult material.

* * * * *